US008800138B2

(12) United States Patent
Tredwell et al.

(10) Patent No.: US 8,800,138 B2
(45) Date of Patent: Aug. 12, 2014

(54) METHOD FOR CONDITIONING A SUBSTRATE SURFACE FOR FORMING AN ELECTRONIC DEVICE THEREON AND RESULTANT DEVICE

(75) Inventors: Timothy J. Tredwell, Fairport, NY (US); Roger S. Kerr, Brockport, NY (US)

(73) Assignee: Carestream Health, Inc., Rochester, NY (US)

( * ) Notice: Subject to any disclaimer, the term of this patent is extended or adjusted under 35 U.S.C. 154(b) by 669 days.

(21) Appl. No.: 12/394,575

(22) Filed: Feb. 27, 2009

(65) Prior Publication Data

US 2009/0291269 A1 Nov. 26, 2009

Related U.S. Application Data

(63) Continuation-in-part of application No. 12/028,194, filed on Feb. 8, 2008, and a continuation-in-part of application No. 12/028,182, filed on Feb. 8, 2008, now abandoned, and a continuation-in-part of application No. 12/028,174, filed on Feb. 8, 2008, now abandoned, and a continuation-in-part of application No. 12/028,206, filed on Feb. 8, 2008, now Pat. No. 7,743,492.

(51) Int. Cl.
*H05K 3/30* (2006.01)

(52) U.S. Cl.
USPC ............. 29/832; 29/825; 29/829; 29/830; 29/428; 977/882; 977/888; 977/896; 156/219; 156/230; 156/242; 174/260

(58) Field of Classification Search
USPC ........ 29/825, 829–832, 848, 428, 592.1, 842; 156/219, 230, 242, 250, 277; 174/260–262; 977/882, 888, 896
See application file for complete search history.

(56) References Cited

U.S. PATENT DOCUMENTS

| | | | |
|---|---|---|---|
| 3,301,730 A * | 1/1967 | Spiwak et al. | 156/267 |
| 5,903,053 A * | 5/1999 | Iijima et al. | 257/751 |
| 6,492,026 B1 | 12/2002 | Graff et al. | |
| 7,045,442 B2 | 5/2006 | Maruyama et al. | |
| 2002/0197771 A1* | 12/2002 | Dotta et al. | 438/114 |
| 2003/0175427 A1* | 9/2003 | Loo et al. | 427/256 |
| 2005/0181541 A1* | 8/2005 | Sakata et al. | 438/117 |
| 2005/0205291 A1* | 9/2005 | Yamashita et al. | 174/254 |
| 2006/0038182 A1* | 2/2006 | Rogers et al. | 257/77 |
| 2007/0091062 A1 | 4/2007 | French et al. | |
| 2008/0026581 A1 | 1/2008 | Tredwell et al. | |
| 2008/0090338 A1 | 4/2008 | Tredwell et al. | |

OTHER PUBLICATIONS

Commonly assigned U.S. Appl. No. 12/394,518, titled: Substrate Formed on Carrier Having Retaining Features and Resultant Electronic Device.

* cited by examiner

*Primary Examiner* — Peter DungBa Vo
*Assistant Examiner* — Jeffrey T Carley

(57) ABSTRACT

A method for forming an electronic device on a flexible substrate conditions a surface of the flexible substrate to increase its malleability and to provide a conditioned substrate surface. A master surface is impressed against the conditioned substrate surface. The master surface is then released from the conditioned substrate surface, thereby forming a circuit-side surface on the substrate. The electronic device is then formed on the circuit-side surface. The substrate may be supported on a carrier during the method.

18 Claims, 15 Drawing Sheets

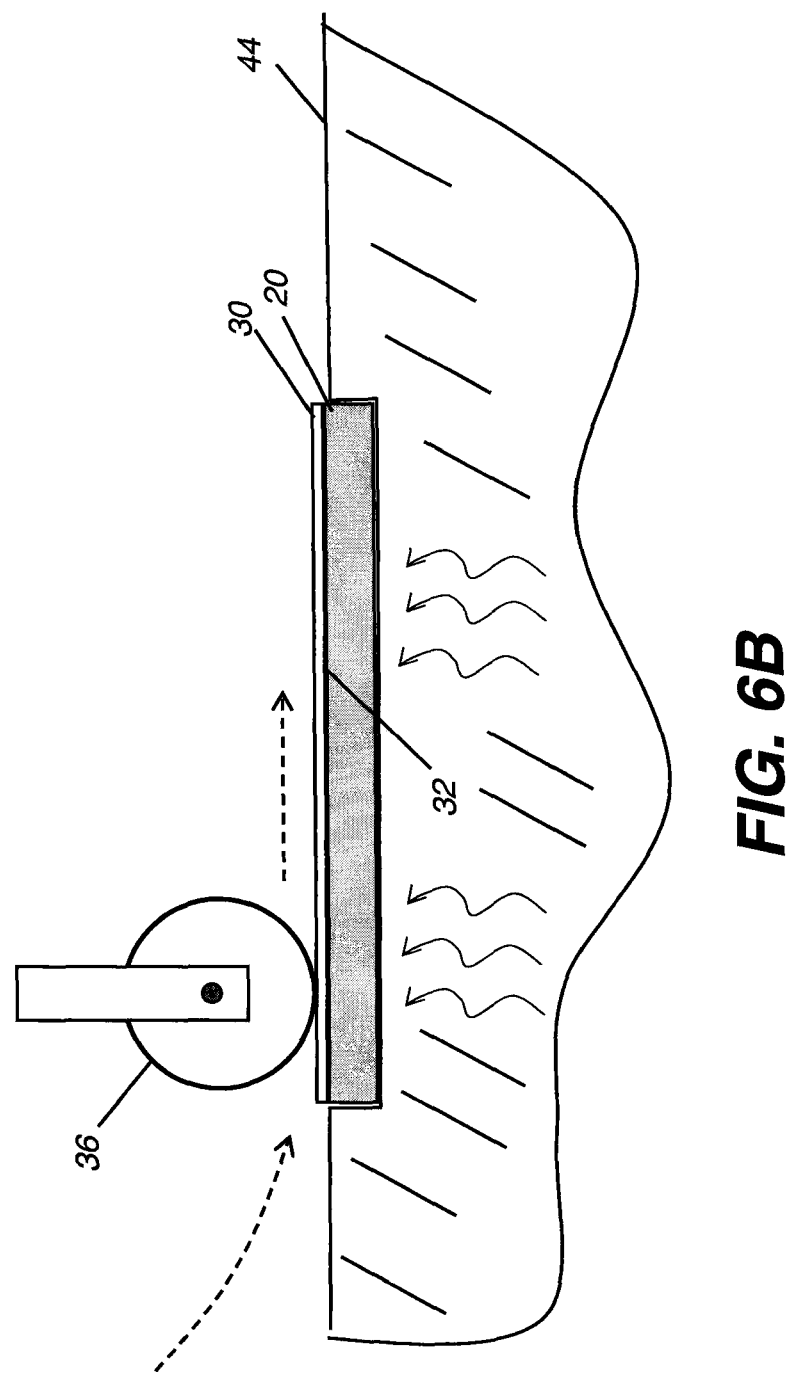

METHOD FOR CONDITIONING A SUBSTRATE SURFACE FOR FORMING AN ELECTRONIC DEVICE THEREON AND RESULTANT DEVICE

CROSS-REFERENCE TO RELATED APPLICATIONS

This application is a Continuation-in-Part of the following commonly assigned, copending:

(a) U.S. patent application Ser. No. 12/028,194 filed Feb. 8, 2008 by Kerr et al. entitled METHOD FOR FORMING AN ELECTRONIC DEVICE ON A FLEXIBLE SUBSTRATE SUPPORTED BY A DETACHABLE CARRIER;

(b) U.S. patent application Ser. No. 12/028,182 filed Feb. 8, 2008 now abandoned by Kerr et al entitled METHOD OF FORMING AN ELECTRONIC DEVICE ON A SUBSTRATE SUPPORTED BY A CARRIER AND RESULTANT DEVICE;

(c) U.S. patent application Ser. No. 12/028,174 filed Feb. 8, 2008 now abandoned by Kerr et al. entitled METHOD FOR FORMING AN ELECTRONIC DEVICE ON A FLEXIBLE METALLIC SUBSTRATE AND RESULTANT DEVICE; and (d) U.S. patent application Ser. No. 12/028,206 filed Feb. 8, 2008 now U.S. Pat. No. 7,743,492 by Kerr et al. entitled METHOD FOR FORMING CAST FLEXIBLE SUBSTRATE AND RESULTANT SUBSTRATE AND ELECTRONIC DEVICE.

The disclosure of each of these applications is incorporated by reference into the present specification.

FIELD OF THE INVENTION

This invention generally relates to electronic device fabrication and more particularly relates to a flexible substrate for electronic device fabrication, wherein the substrate surface is conditioned by conformance to the master surface.

BACKGROUND OF THE INVENTION

There is an interest in the development of flexible circuitry for use in a range of devices, including electro-optical arrays and display panels. Proposed solutions for fabricating thin-film transistor (TFT) devices, used in switching and driver circuitry, onto flexible metallic and plastic substrates have not yet met with commercial success, however.

Conventionally, TFT devices have been fabricated on rigid substrates, typically glass or silicon, using a well-known sequence of deposition, patterning and etching steps. For example, amorphous silicon TFT devices require deposition, patterning, and etching of metals, such as aluminum, chromium or molybdenum; of amorphous silicon semiconductors; and of insulators, such as $SiO_2$ or $Si_3N_4$, onto a substrate. The semiconductor thin film is formed in layers having typical thicknesses ranging from several nanometers (nm) to several hundred nm, with intermediary layers having thicknesses on the order of a few microns, and may be formed over an insulating surface that lies atop the rigid substrate.

The requirement for a rigid substrate has been based largely on the demands of the fabrication process itself. Rigidity allows the fabrication system to more accurately register the substrate in position for the different process steps. Thermal characteristics are also particularly relevant. TFT devices are fabricated at relatively high temperatures, making it difficult to work with many types of plastics and with some metals, due to thermal expansion characteristics.

Thus far, the range of substrate materials that have been used successfully is somewhat limited, generally to glass, quartz, or other rigid, silicon-based materials.

TFT devices have been successfully formed on some types of metal foil and plastic substrates, indicating that there is at least some measure of flexibility that can be allowed for their fabrication. However, inherent problems include material incompatibility between the substrate and TFT materials, thermal expansion mismatch between substrate and device layers, and difficulties with planarity or smoothness and surface morphology. It is desirable to have these problems satisfactorily resolved in order to make commercialization a reality.

The fabrication process for the TFT can require temperatures typically in the range of 125-300 degrees C. or higher, including temperatures at levels where many types of plastic substrates would be unusable. Thus, it is widely held, as is stated in U.S. Pat. No. 7,045,442 (Maruyama et al.), that a TFT cannot be directly formed on a plastic substrate.

U.S. Pat. No. 6,492,026 (Graff et al.) discloses the use of flexible plastic substrates having relatively high glass transition temperatures Tg, typically above 120 degrees C. However, the capability for these substrates to withstand conventional TFT fabrication temperatures much above this range is questionable. Moreover, in order to use these plastics, considerable effort is expended in protecting the substrate and the device(s) formed from scratch damage and moisture permeation, such as using multiple barrier layers. The use of high-performance plastics, as is noted in the Graff et al. '026 disclosure, still leaves thermal expansion difficulties (expressed using Coefficient of Thermal Expansion, CTE). Solutions of this type generally require additional planarization and isolation layers and processes in order to protect the plastic.

One problem relates to surface quality of the substrate, also termed planarity. TFT fabrication requires that the substrate surface be extremely smooth, with no more than about 50 nm peak-to-peak roughness. However, this level of smoothness is extremely difficult to achieve without special tooling or other processing of the plastic. Even methods such as spin coating or other deposition techniques are not able to achieve smoothness at this level repeatably and at low cost.

U.S. Patent Application Publication No. 2007/0091062 entitled "Active Matrix Displays and Other Electronic Devices Having Plastic Substrates" by French et al. describes forming a flexible substrate by first depositing substrate material onto a glass carrier plate, with an optional release layer between them. Then, once the substrate thickness is achieved, the exposed substrate surface can be treated for planarization, such as by adding one or more additional layers, and circuit components such as TFT arrays can be fabricated thereon. At the end of the component fabrication process, the substrate and its circuitry are then removable from the glass carrier, such as using a laser release process.

With methods such as those disclosed in the US 2007/0091062 French et al. application, care is taken to provide a smooth and uniform surface, using deposition methods such as spin coating, skiving with a blade, or various printing techniques. However, even with the use of spin coating and other highly precise deposition methods, the surface of the deposited substrate may still need further treatment steps to improve planarization before circuit lay-down can begin. This adds complexity and cost to the electronic device fabrication process. Moreover, conventional solutions are directed to smoothing the surface and there can be applications where it is useful not only to provide surface smoothness, but also to provide one or more relief features in the substrate.

Various techniques for supporting a flexible substrate on a carrier have been developed. For example, reference is made to U.S. Patent Application 2008/0026581 (Ser. No. 11/461,080) filed Jul. 31, 2006 by Tredwell et al. entitled FLEXIBLE SUBSTRATE WITH ELECTRONIC DEVICES FORMED THEREON; and U.S. Patent Application 2008/0090338 (Ser. No. 11/538,173) filed Oct. 3, 2006 by Tredwell et al. entitled FLEXIBLE SUBSTRATE WITH ELECTRONIC DEVICES AND TRACES. The disclosure of each of these applications is incorporated by reference into the present specification.

Thus, it can be seen that although there has been interest in developing and expanding the use of plastics as flexible substrates, there is still a need for extra steps in surface treatment, such as planarization.

SUMMARY OF THE INVENTION

The present invention addresses the need for flexible substrates for electronic device fabrication. With this object in mind, the present invention provides a method for forming an electronic device on a flexible substrate comprising steps of conditioning a surface of the flexible substrate to increase its malleability and to provide a conditioned substrate surface thereby; impressing a master surface against the conditioned substrate surface; releasing the master surface from the conditioned substrate surface, thereby forming a circuit-side surface on the substrate; and forming the electronic device on the circuit-side surface. The substrate may be supported on a carrier during the method. The invention also provides an electronic device made in accordance with the described method.

A feature of the present invention is that it provides a flexible substrate with a surface that is suitably conditioned for fabrication of electronic devices thereon. The range of flexible substrates available using embodiments of the present invention can include various types of plastics and some metals.

An advantage of the present invention is that it provides a substrate having a circuit-side surface that is featured according to a master surface and that can be used with a carrier formed from glass or other material.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings.

FIGS. 6A, 6B, and 6C show a sequence of steps for forming a substrate surface using a single pressure roller;

DETAILED DESCRIPTION OF THE INVENTION

Reference also is made to commonly assigned, copending U.S. patent application Ser. No. 12/394,518 filed Feb. 27, 2009 by Tredwell et al, entitled SUBSTRATE FORMED ON CARRIER HAVING RETAINING FEATURES AND RESULTANT ELECTRONIC DEVICE, incorporated herein by reference.

It is to be understood that elements not specifically shown or described in the following detailed description may take various forms well known to those skilled in the art.

Figures given in this application are representative of overall spatial relationships and arrangement of layers for deposition onto a substrate and may not be drawn to scale. As the term is used in the present description, "plastic" refers to a material having a high polymer content, usually made from polymeric synthetic resins, which may be combined with other ingredients, such as curing agents, fillers, reinforcing agents, colorants, and plasticizers. A "resin" can be a synthetic or naturally occurring polymer. Plastic is solid in its finished state, and at some stage during its manufacture or processing into finished articles, can be shaped by flow. Plastics are typically formed using a curing process, in which a solvent may be evaporated at a suitable rate. Curing can also be performed using ultraviolet (UV) light or other energy source. Plastic includes thermoplastic materials and thermosetting materials. The term "flexible" as used in the context of the present disclosure refers generally to sheet materials that are thinner than about 1.5 mm.

As understood by those skilled in the art, the term "malleable" refers to a material that is capable of being extended or shaped by hammering, pressing with a smooth or featured die, or pressing with a smooth or featured roller. Thus, an exposed surface of a substrate made from such a material is sufficiently pliant for accepting and retaining an impression from a master surface. The amount of malleability that is needed for a particular substrate material depends largely on the material itself and may require some experimentation with different polymers or metals.

Figure 1:
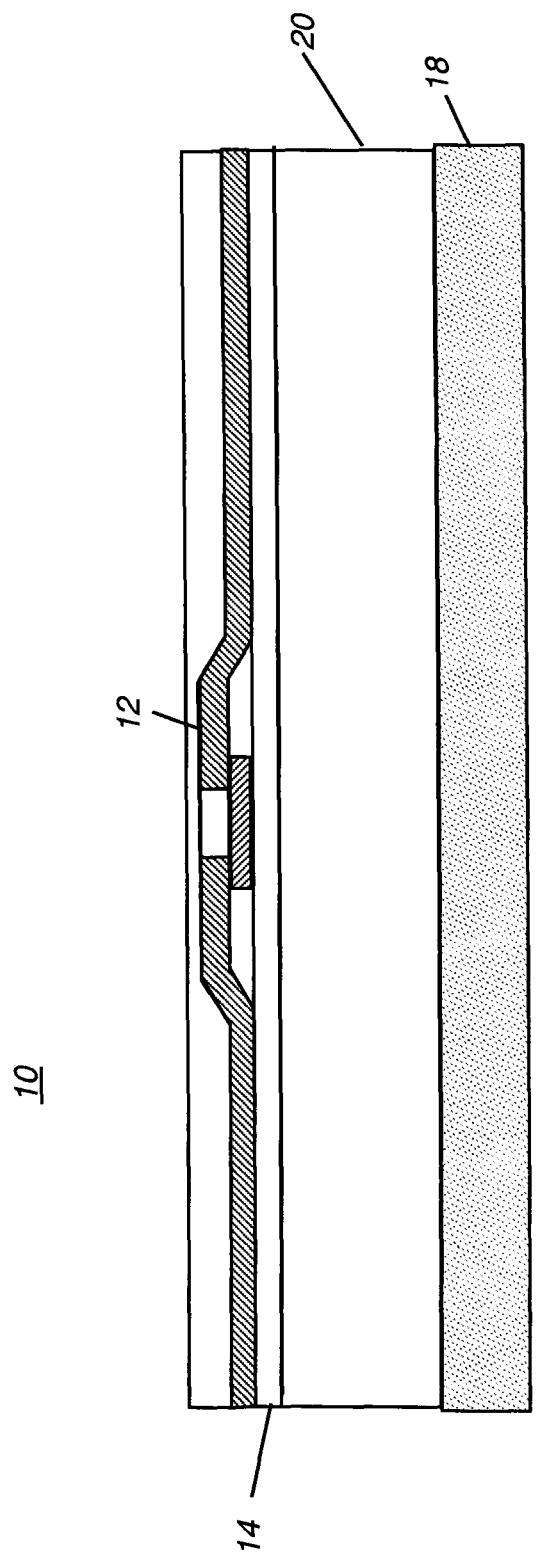
FIG. 1 is a side view of an electronic device formed on a flexible substrate supported on a carrier.

Referring to FIG. 1, there is shown an electronic device 10 formed on a carrier 18 using an approach described in U.S. patent application Ser. No. 11/461,080, previously mentioned. A thin-film component 12, such as a conductor, a thin-film transistor, a diode, or other component, is formed onto a flexible substrate 20 such as a plastic film or metal foil. During device fabrication, substrate 20 is supported on carrier 18 that provides dimensional stability for substrate 20 over the range of processing temperatures and conditions required for thin-film device manufacture.

An optional planarization or isolation layer 14 is typically applied to substrate 20 before components can be formed. This layer helps to smooth the surface and provide the needed surface quality that is required for thin-film circuitry fabrication. The thickness of planarization layer 14 depends on the roughness of the surface over which this layer is formed. Wherever a planarization treatment is needed, it is advantageous to make any planarization layer as thin as possible. For TFT and similar devices, this surface needs minimal surface roughness, no more than about 0.2-0.3 microns (peak-to-peak) and preferably no more than about 50 nm.

Figure 2A:
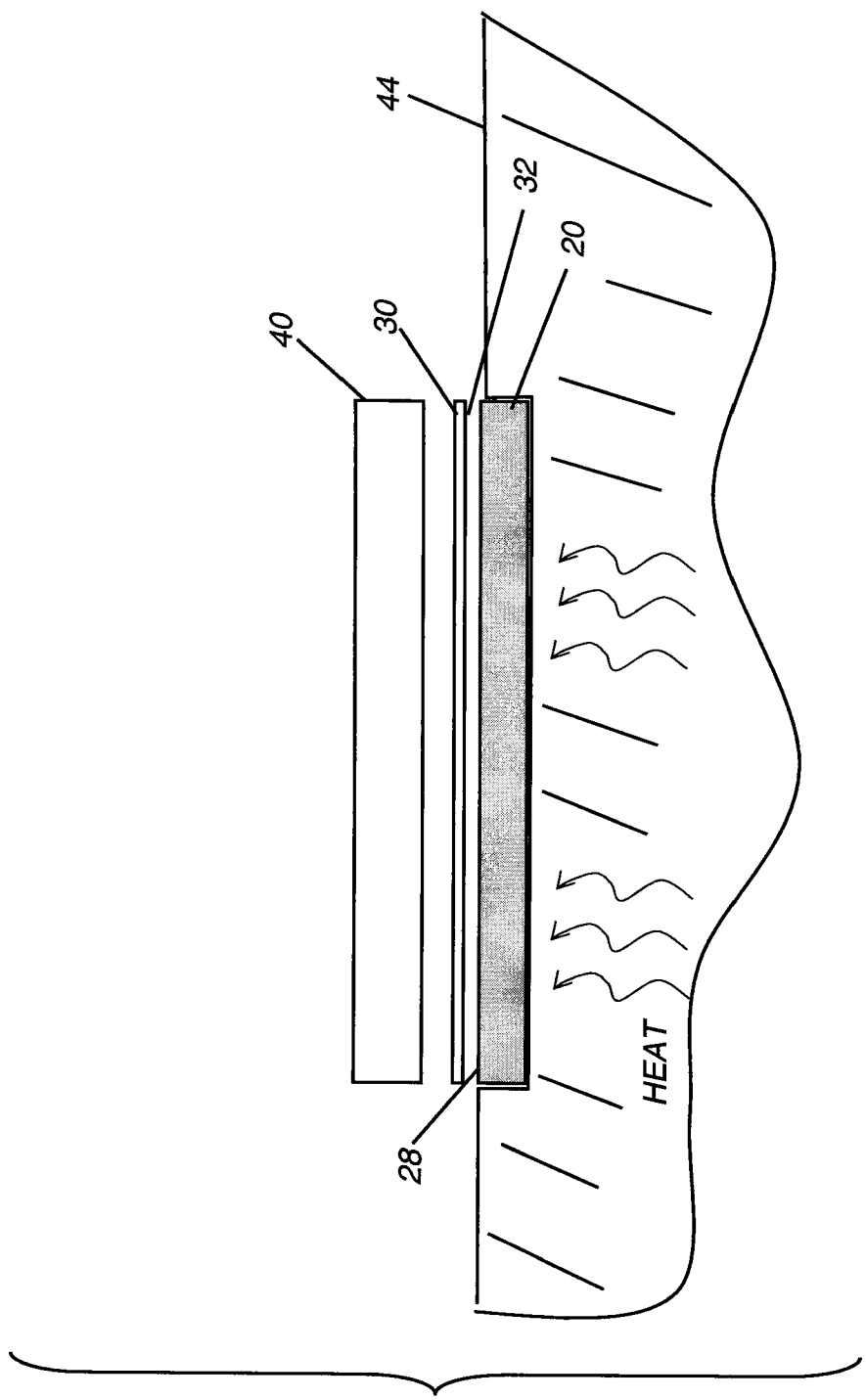
FIG. 2A is an exploded, schematic side view showing components used for conditioning a substrate surface in accordance with the invention.
Figure 2B:
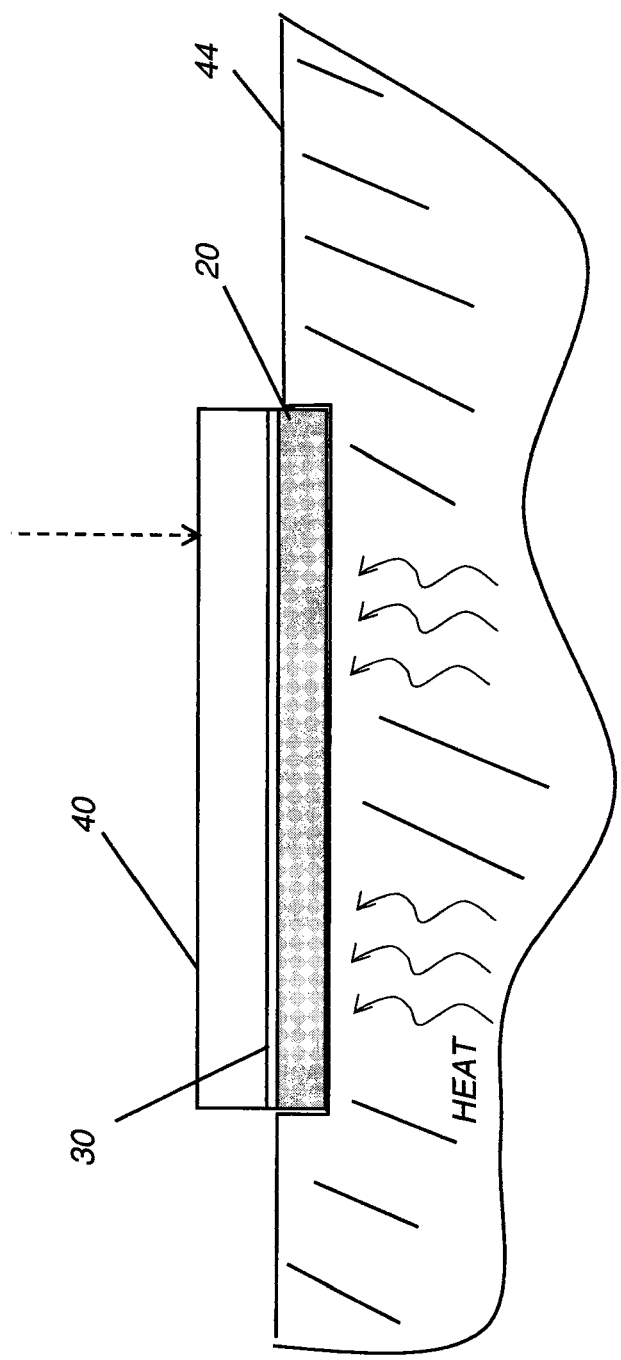
FIG. 2B shows a side view of the components of FIG. 2A engaged to condition a substrate surface.
Figure 2C:
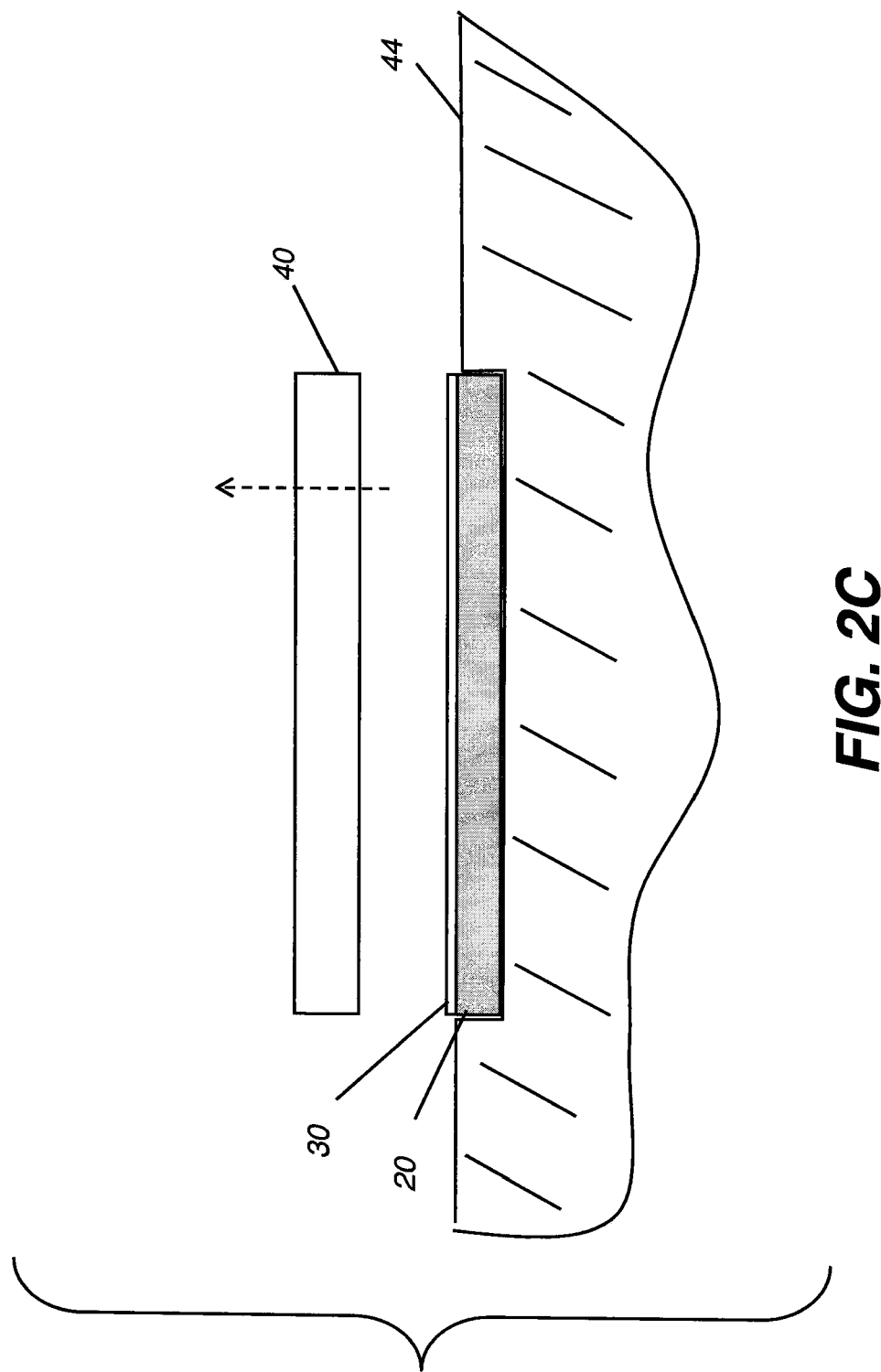
FIG. 2C shows the components of FIG. 2B following withdrawal of a pressure plate.
Figure 2D:
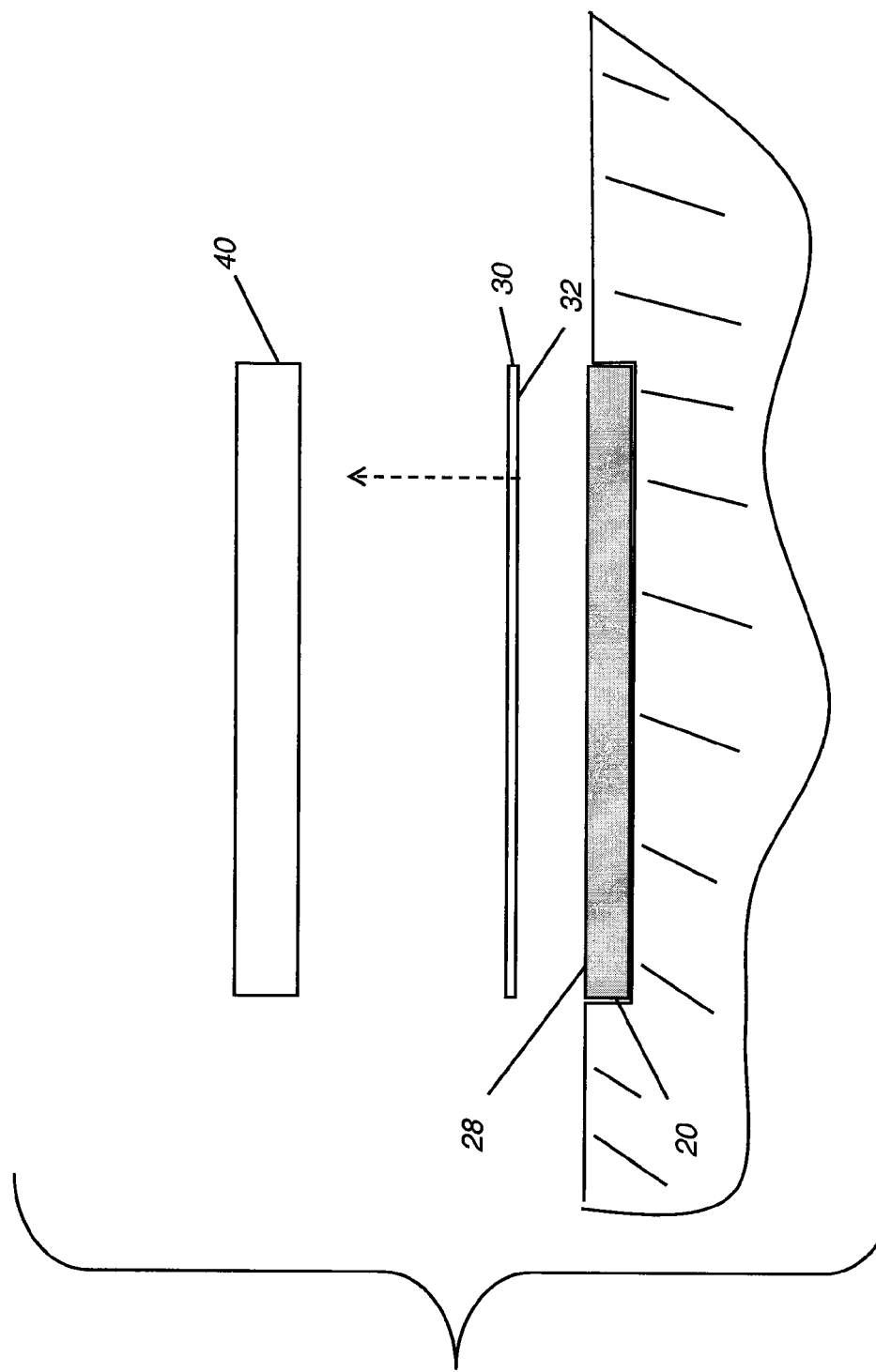
FIG. 2D shows the components of FIG. 2C following withdrawal of a conditioning master from a substrate surface.

FIGS. 2A through 2D show one embodiment of a sequence or method for forming a circuit-side surface 28 of substrate 20. Substrate 20 is first treated in order to condition its surface for increased malleability. Heat is applied to a support 44 holding or supporting substrate 20. Alternatively, in accordance with the invention, substrate 20 could be supported on carrier 18 while the two components are held or supported by support 44. In either event, a master 30 is then applied against circuit-side surface 28 of substrate 20. Master 30 includes on its underside, as illustrated, a master surface 32 that in use is impressed against the conditioned, malleable surface of substrate 20, as shown in FIG. 2B. A pressure plate 40 or other pressure source is then used to press master surface 32 against circuit-side surface 28. Pressure plate 40 is then removed, as shown in FIG. 2C. Releasing master surface 32 is shown in FIG. 2D. The resulting circuit-side surface 28 bears the imprint of master surface 32. An optional planarization layer (not shown) may or may not then be needed on top of circuit-side surface 28. Substrate 20, or the combination of substrate 20 and carrier 18 as the case may be, may then be removed from support 44 or removed following additional treatment.

Figure 3:
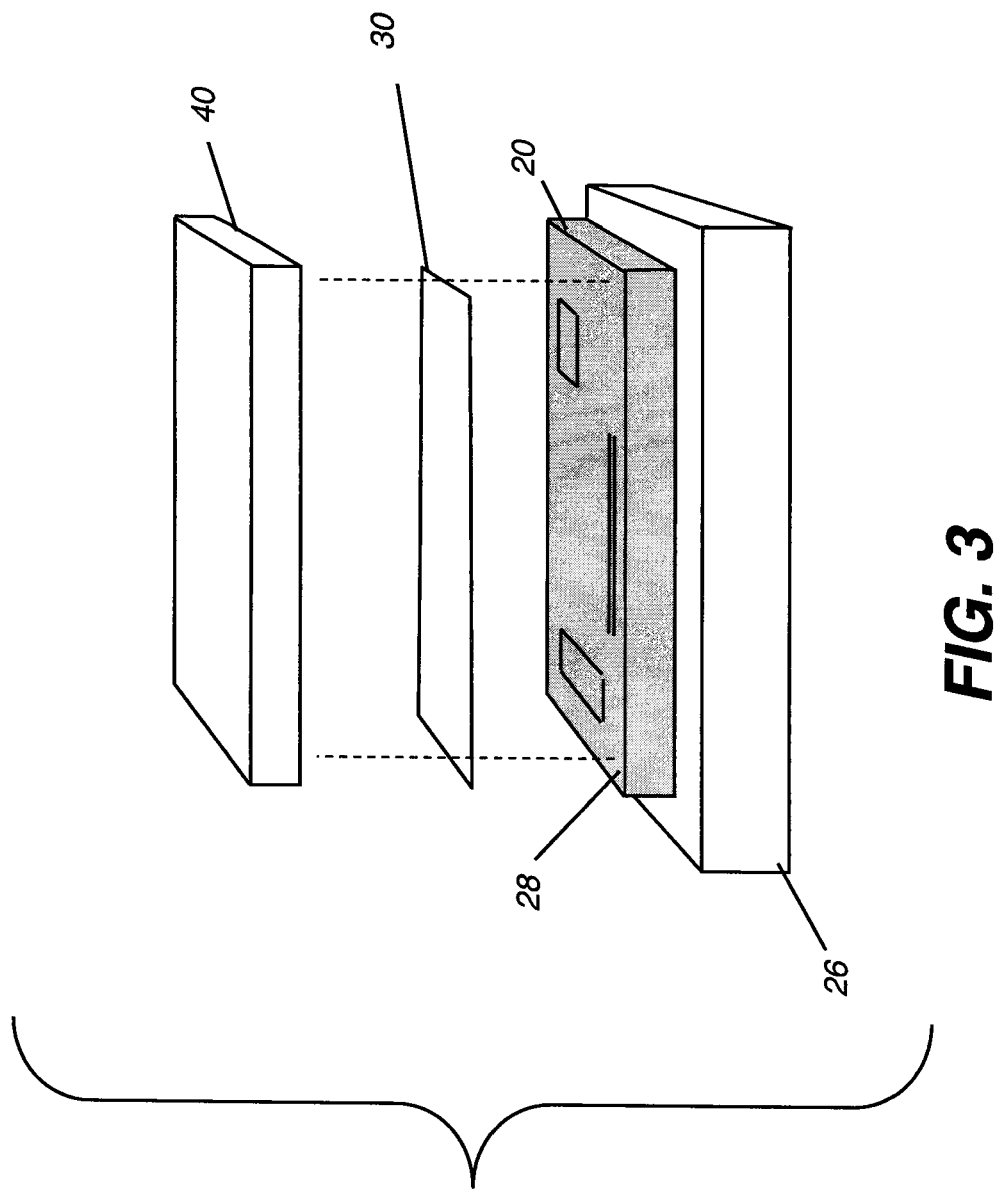
FIG. 3 is an exploded view of the components used for surface preparation in embodiments of the present invention.
Figure 4:
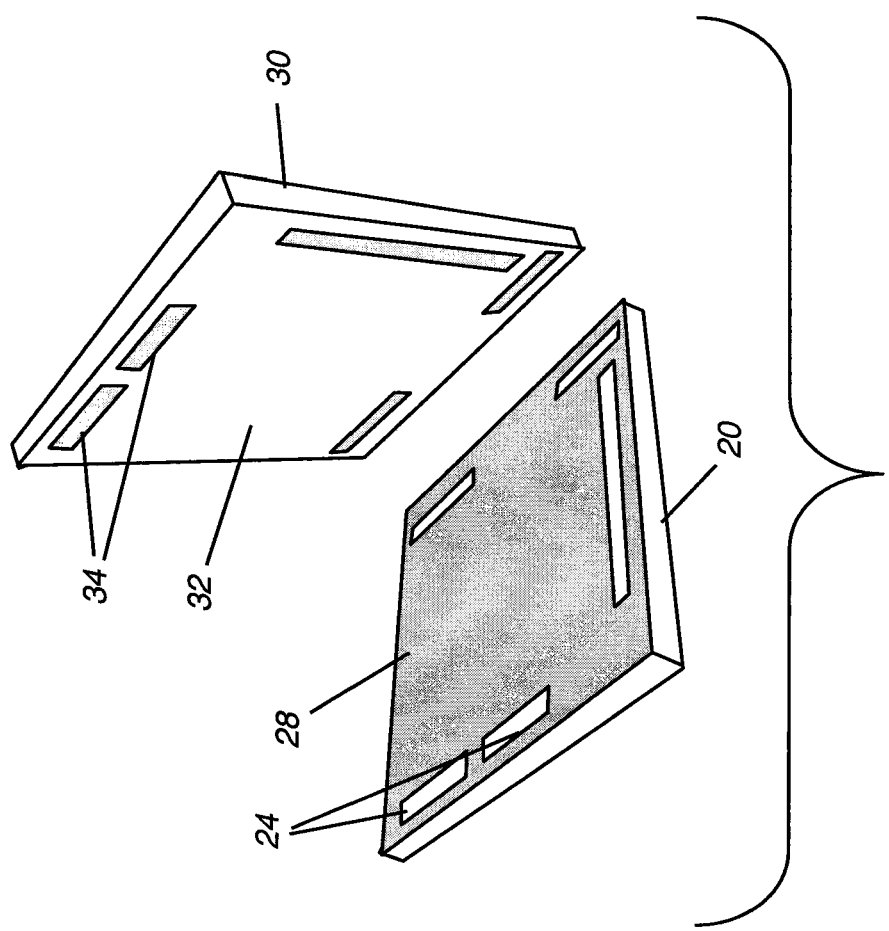
FIG. 4 is an exploded, perspective view of a substrate surface that has been processed to replicate a master surface having a number of features.

The exploded view of FIG. 3 shows another embodiment of the elements that may be used to form circuit-side surface 28. Here, master 30 is a sheet material and can be relatively rigid or flexible. Master 30 may be smooth in order to provide a highly smooth surface for circuit-side surface 28. Optionally, as shown in FIGS. 3 and 4, master 30 may be patterned on its underside, as illustrated, thereby impressing a pattern onto circuit-side surface 28. The pattern that is formed may include part of the structure of an electronic device 10 for example. Master 30 may be of glass, metal, or other material that is capable of having a highly finished surface. Master 30 alternately may be a plastic sheet material that is prevented from bonding to the surface of substrate 20 by a release agent or other intermediate material, for example. Substrate 20 may be supported on a carrier 18 as shown in FIG. 1, a carrier 26 as shown in FIG. 3 or in some other manner.

There are a number of methods available for conditioning the surface of substrate 20 so that it is more malleable for accepting the imprint of master 30. In the embodiment of FIGS. 2A-2D, heat is used. Heat can be applied to substrate 20 as well as to master 30 or pressure plate 40 or to some combination of these elements. In an alternate embodiment, a solvent may be applied to the surface of substrate 20 to soften the material and increase its malleability. As yet another alternative, uncured or partially cured polymer may also be used. Curing is then performed after removal of master 30.

Release of master surface 32 may be enabled in any of a number of ways. Heat or solvents may be applied to help in its removal. In an alternate embodiment, a light coating of a release agent may be used as an intermediate material that is applied prior to processing so that master 30 can be peeled from circuit-side surface 28 without damage. Selection of a suitable release agent for a particular material would be a skill familiar to one skilled in the art of plastics fabrication. Careful cleaning is then executed to remove intermediate material from circuit-side surface 28 before proceeding to electronic device fabrication steps. In another embodiment, vacuum can be used to hold substrate 20 or master 30 more firmly during separation.

Figure 5:
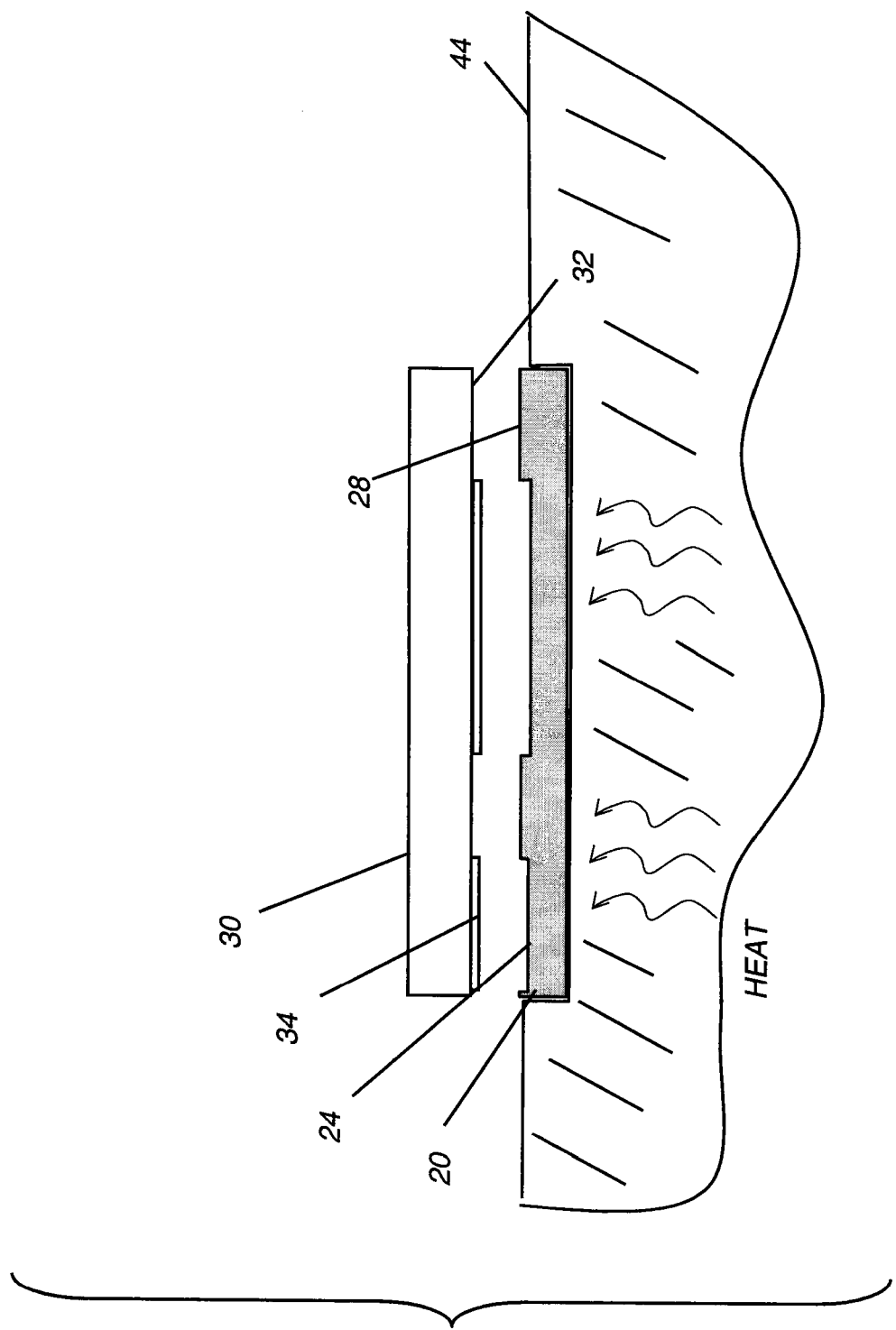
FIG. 5 is an exploded cross-section view showing release of the master surface from the circuit-side surface of a substrate in one embodiment.

The use of a separate pressure plate 40 is optional. FIGS. 4 and 5 show embodiments in which master 30 is sufficiently sturdy that it alone can transmit enough force when pressed against the surface of substrate 20. Master 30 in FIG. 4 is patterned, having a number of features 34 formed on master surface 32. Following the step in which the surface of master 30 is impressed against the surface of substrate 20, features 24 are formed on substrate 20 that replicate features 34 provided on master 30. FIG. 5 is a side view showing how features 24 are formed in conformance with features 34 on master surface 32. For the embodiments of FIGS. 4 and 5, some type of release agent or mechanism may be used to help facilitate separation as master surface 32 is released from circuit-side surface 28. A lubricant, solvent, or other fluid or material can be used as a release agent. Heat or cooling could also be used for releasing the master surface. A curing process could also be completed while master surface 32 is applied, thereby freeing master surface 32 from circuit-side surface 28.

Figure 6A:
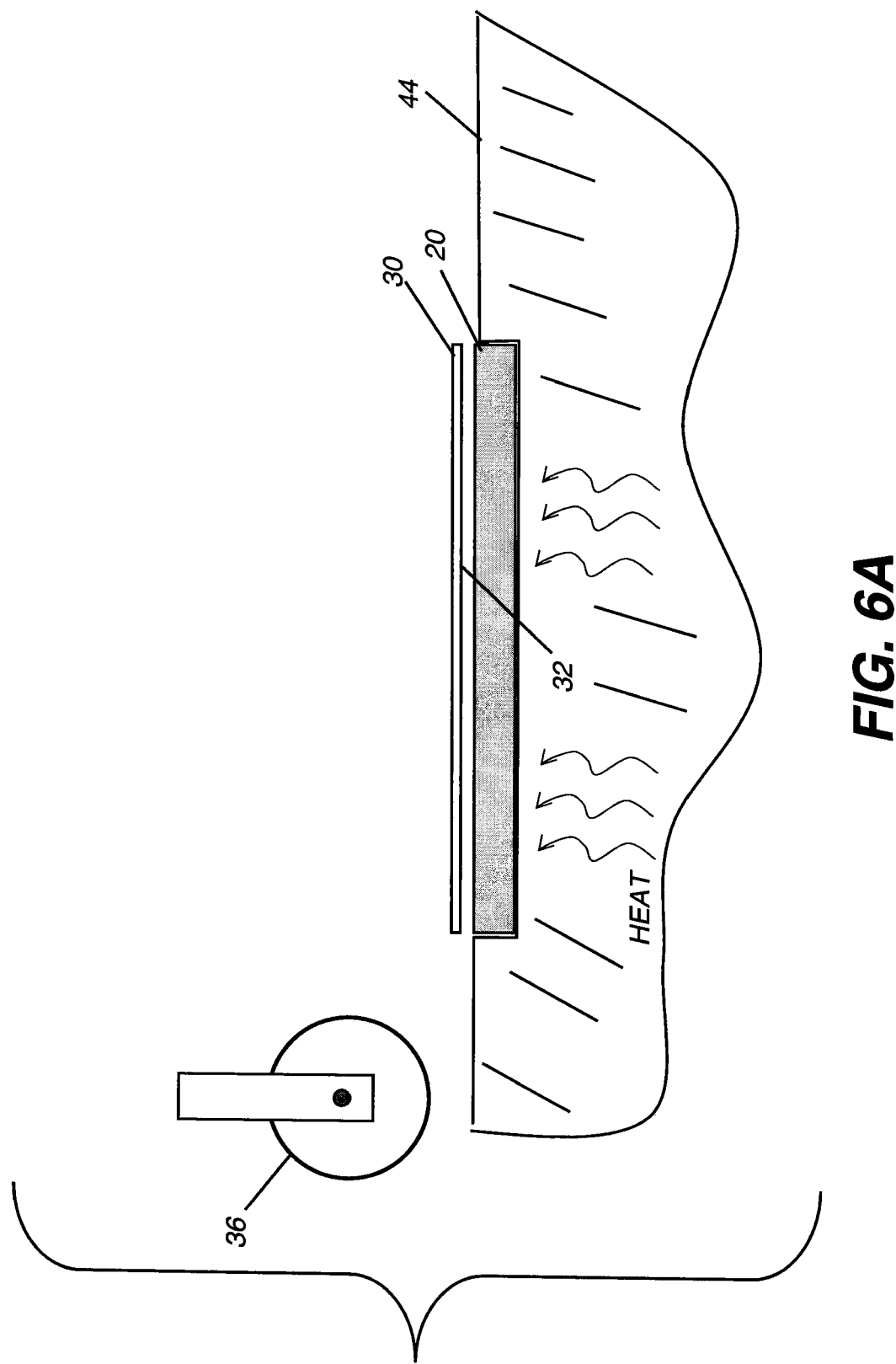
Figure 6C:
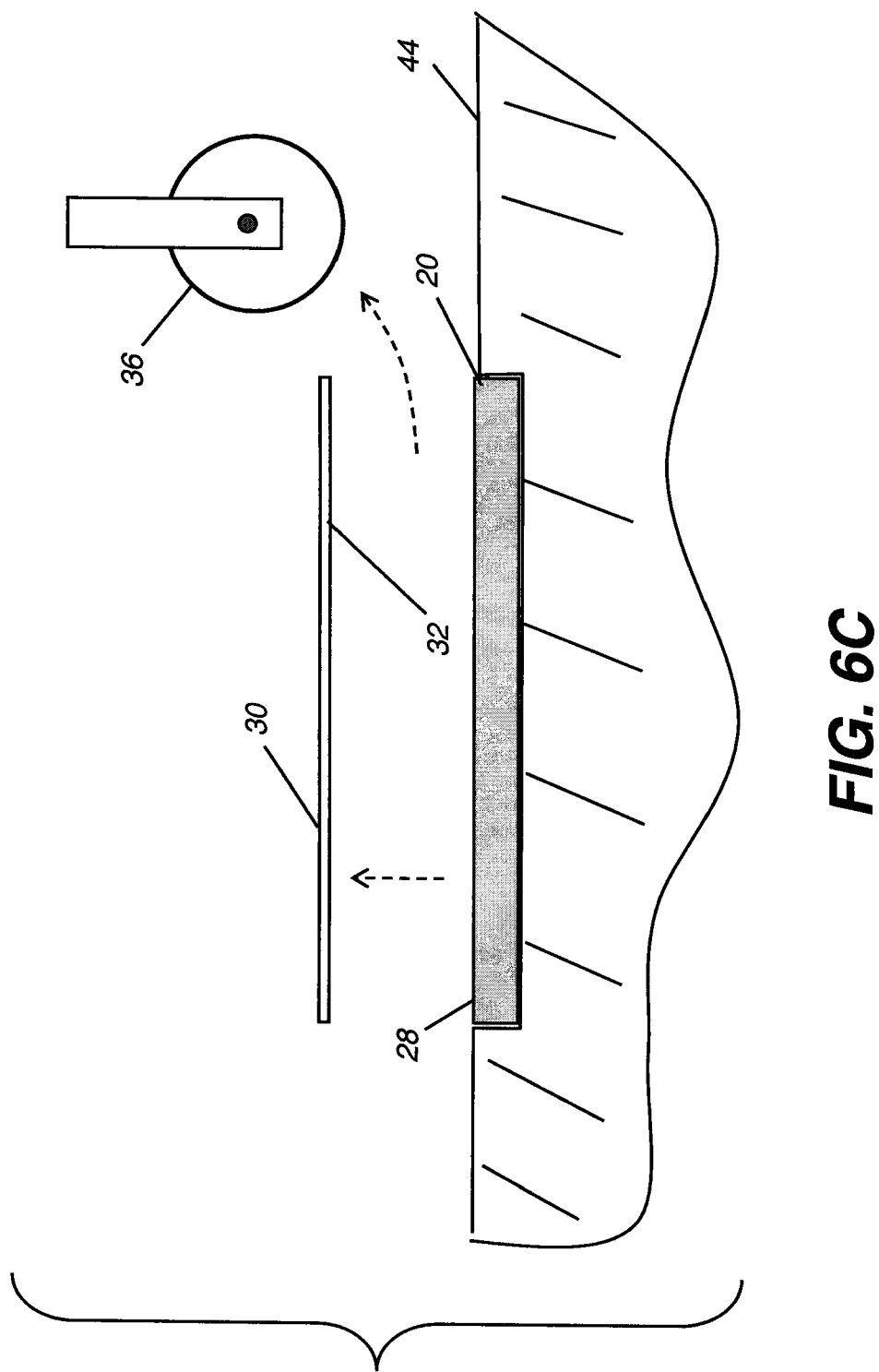

FIGS. 6A, 6B, and 6C show the use of a roller 36 for momentarily impressing master surface 32 against substrate 20. As before, in accordance with the invention, substrate 20 could be supported on carrier 18 while the two components are held or supported by support 44 during application of roller 36. In FIG. 6A, master 30 is applied on or near the surface of substrate 20. Heat is applied to substrate 20, such as by heating support 44. Alternately, roller 36 could be heated or both substrate 20 and roller 36 could be heated. Roller 36 is lowered and travels against the back of master 30, impressing master surface 32 against substrate 20 in FIG. 6B. Then, in FIG. 6C, roller 36 moves away to allow removal of master 30.

Figure 7A:
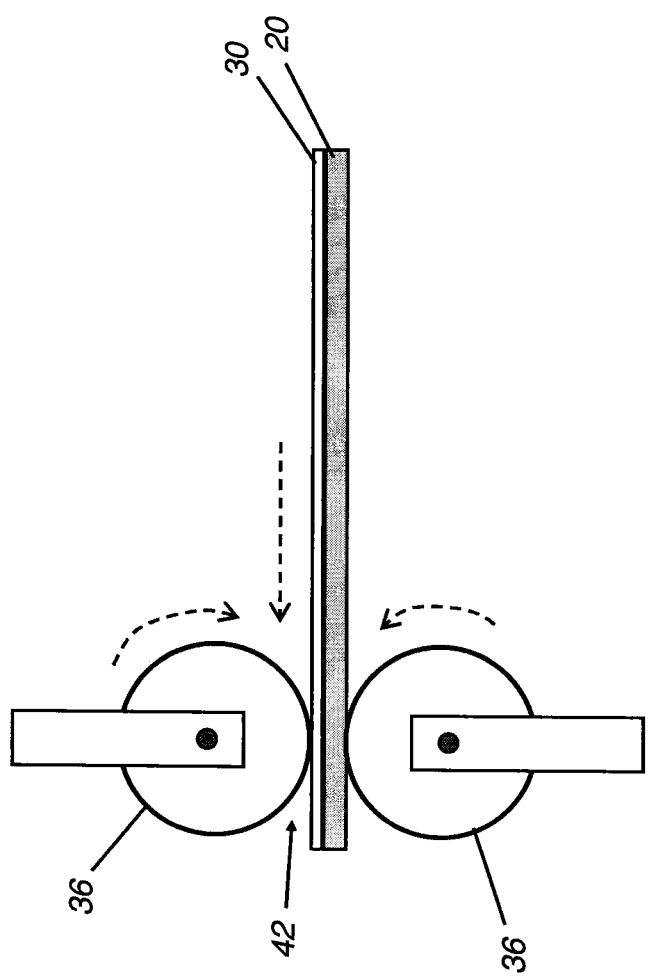
FIGS. 7A and 7B show steps for processing the substrate surface in the nip between a pair of pressure rollers.
Figure 7B:
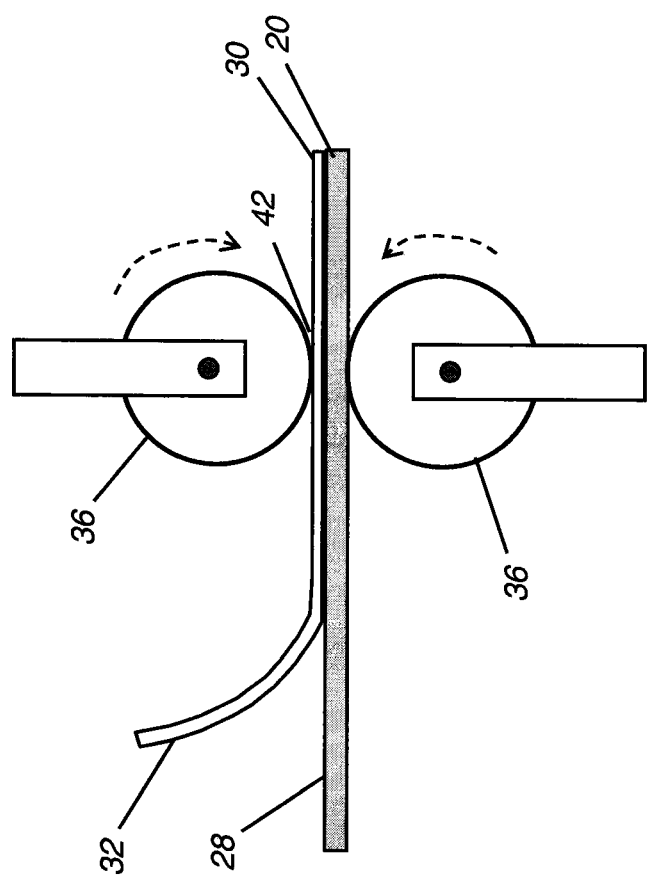

The cross-section view of FIG. 7A shows the use of two rollers 36 for applying pressure. Substrate 20 and master 30 are fed through a nip 42 between rollers 36, applying pressure for master surface 32 replication. FIG. 7B shows peeling of master 30 from circuit-side surface 28. Again, substrate 20 could be supported on carrier 18 while the two components and master 30 are passed between rollers 36.

Figure 8:
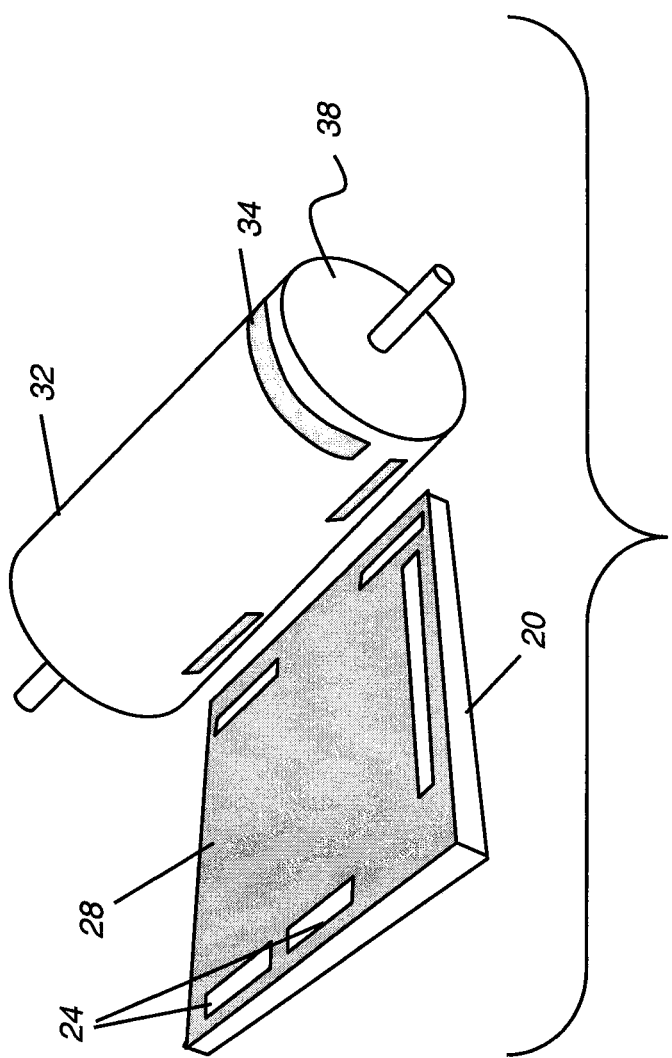
FIG. 8 is a perspective view of a patterned master roller used for substrate fabrication.

FIG. 8 shows a perspective view of a process for substrate 20 fabrication using a patterned roller 38 with an outer, cylindrical master surface 32. As was described earlier with reference to FIG. 4, features 24 on circuit-side surface 28 replicate features 34 on the roller surface.

Figure 9B:
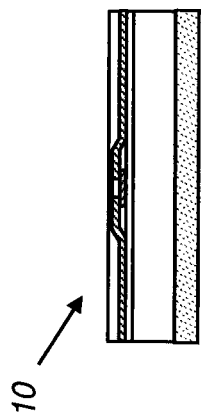
FIGS. 9A and 9B are side views showing formation of an electronic device on the surface of a substrate prepared according to methods of the present invention.
Figure 9A:
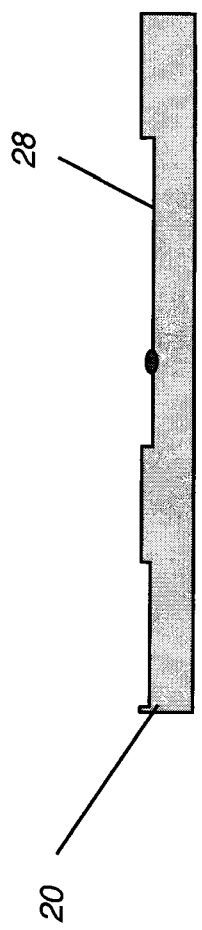

The method of the present invention enables a flexible substrate to be prepared with a surface that is suitable for fabrication of electronic devices thereon. Additional planarization material may be used, added in order to provide improved smoothness, but may not be necessary. As is shown in the side view of FIG. 9A, one or more electronic devices 10 of the types shown in FIGS. 1 and 9B, can be formed on circuit-side surface 28 of substrate 20 prepared according to methods of the present invention.

The method of the present invention admits a number of embodiments for initially forming substrate 20. Substrate 20 can be a plastic provided in an uncured or partially-cured state, then processed and cured as part of, or following, surface 28 preparation. As mentioned, substrate 20 could alternately be deposited onto carrier 18 or 26 for this surface conditioning (FIG. 3) or could be provided in sheet form or in some other form.

Material for substrate sheet 20 can be selected from a range of polymers, based on desired properties. Some suitable plastic materials of special interest include polyimide, as noted earlier, and polytetrafluoroethylene (PTFE) or poly(perfluoro-alboxy)fluoropolymer (PFA), known commercially as Teflon®, sold by DuPont, Inc. Sufficiently malleable metals could alternately be used.

Example

In one embodiment, a polyimide sheet is used for flexible substrate sheet 20. Nominal thickness for this sheet is less than 1 mm. For this embodiment, a smooth circuit-side surface is required.

Given this material, TFT fabrication processing using a flexible substrate sheet 20 is as follows:

1. Preparation of master 30. A glass master is used, providing a highly smooth master surface 32.
2. Conditioning of substrate 20. Heat is used to soften the polyimide substrate material sufficiently for surface treatment. As before, in accordance with the invention, substrate 20 could be supported on carrier 18 or 26 during conditioning. A temperature of up to 300 degrees C. is applied for up to about 5 minutes in order to obtain the desired surface malleability or compliance.
3. Application of master surface 32. A light layer of lubricant is applied to master surface 32 as a release agent. Master 30 is then applied against the conditioned substrate.
4. Application of pressure. Pressure plate 40 is used to apply an even pressure against master 30.
5. Release of master 30. Heat is removed so that substrate 20 begins to cool. Then, substrate 20 can be peeled from master 30 and cleaned to remove any trace lubricant or other materials.
6. Mounting of substrate 20 onto a carrier, if required. This step supports substrate 20 for the component fabrication process. Alternatively, the substrate could be mounted to the carrier after step 2.
7. Component fabrication. One or more circuit elements are then patterned onto flexible substrate sheet 20. Substrate sheet 20 can then be removed from its carrier.

Enabling substrate sheet 20 to be featured by casting in this way expands upon the capabilities for fabrication of circuit components on circuit-side surface 28. Forming indentations on circuit-side surface 28, for example, can allow subsequent deposition and patterning steps to apply materials of various thicknesses.

Notably, planarization layer 14 in the arrangement of FIG. 1, may not be needed with embodiments of the present invention, since circuit-side surface 28 can be made extremely smooth, with peak-to-peak roughness not exceeding about 50 nm or less.

The electronic device formed on substrate sheet 20 can be used to provide signals to or from any of a number of different types of components and would have particular applications for image display pixels or image sensing pixels. For example, the electronic device formed on the circuit-side surface 28 can be coupled with a corresponding liquid crystal pixel, light-emitting diode pixel, or organic light-emitting diode pixel for display, for example. For image sensing, the electronic device formed on the substrate sheet 20 surface can be coupled with a stimulable phosphor pixel or with another type of sensor pixel, including a biological detector. Thus, what is provided is a method for fabrication of an electronic device on a flexible substrate.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention.

PARTS LIST

10. Electronic device
12. Thin-film component
14. Planarization or isolation layer
18. Carrier
20. Flexible substrate sheet
24. Feature
26. Carrier
28. Circuit-side surface
30. Master
32. Master surface
34. Feature
36. Roller
38. Patterned roller
40. Pressure plate
42. Nip
44. Support

The invention claimed is:

1. A method for forming an electronic device on a flexible substrate comprising:
   conditioning a surface of the flexible substrate to increase its malleability and provide a conditioned substrate surface;
   impressing a master surface including a surface roughness less than 50 nanometers against the conditioned flexible substrate surface;
   releasing the master surface from the conditioned substrate surface, thereby forming a circuit-side surface including a surface roughness less than 50 nanometers on the substrate; and
   forming the electronic device on the circuit-side surface, wherein said forming comprises depositing and patterning materials to form a thin-film transistor device on the circuit-side surface.

2. The method of claim 1 wherein conditioning the surface of the flexible substrate comprises applying heat.

3. The method of claim 1 wherein conditioning the surface of the flexible substrate comprises applying a solvent.

4. The method of claim 1 wherein the master surface is glass or metal.

5. The method of claim 1 wherein the master surface is a roller surface.

6. The method of claim 1 wherein the master surface is featured, wherein a surface roughness of features on the circuit-side surface include the surface roughness less than 50 nanometers.

7. The method of claim 1 further comprising
   applying an intermediate material between the master surface and the conditioned substrate surface before impressing the master surface against it; and
   removing the intermediate material once the master surface has been released.

8. The method of claim 1 wherein conditioning the surface of the flexible substrate comprises providing the substrate as a plastic in an uncured state.

9. The method of claim 1 further comprising applying a planarization material to the circuit-side surface.

10. The method of claim 1 wherein impressing a master surface against the conditioned substrate surface comprises passing the substrate and master through a nip between two rollers.

11. The method of claim 1 wherein impressing a master surface against the conditioned substrate surface comprises using a pressure plate.

12. The method of claim 1 wherein the flexible substrate is plastic.

13. The method of claim 1, further comprising supporting the substrate on a carrier during the conditioning, impressing, releasing and forming.

14. The method of claim 1, further comprising supporting the substrate on a carrier during the impressing, releasing and forming.

15. The method of claim 1, further comprising supporting the substrate on a carrier during the forming.

16. The method of claim 1, further comprising depositing and patterning materials to form the electronic device on the circuit-side surface.

17. The method of claim 1, wherein the featured surface is configured to determine a dimension of the semiconductor device on the circuit-side surface.

18. A method for forming an electronic device on a flexible substrate comprising:
- conditioning a surface of the flexible substrate to increase its malleability and provide a conditioned substrate surface;
- impressing a master surface against the conditioned flexible substrate surface;
- releasing the master surface from the conditioned substrate surface, thereby forming a circuit-side surface including a surface roughness less than 50 nanometers on the substrate; and
- forming the electronic device on the circuit-side surface, wherein said forming comprises depositing and patterning materials to form a thin-film transistor device on the circuit-side surface, where the master surface is featured, and where a surface roughness of features on the circuit-side surface include the surface roughness less than 50 nanometers.

* * * * *